United States Patent [19]

McGraw et al.

[11] Patent Number: 5,796,164

[45] Date of Patent: *Aug. 18, 1998

[54] PACKAGING AND INTERCONNECT SYSTEM FOR INTEGRATED CIRCUITS

[75] Inventors: Mark T. McGraw, Saratoga; Bradley L. Griswold, San Jose; Chung W. Ho, Monte Sereno; Byoung-Youl Min, Cupertino; Michael I. Grove, Redwood City; William C. Robinette, Jr., Los Altos, all of Calif.

[73] Assignee: MicroModule Systems, Inc., Cupertino, Calif.

[*] Notice: The term of this patent shall not extend beyond the expiration date of Pat. No. 5,422,514.

[21] Appl. No.: 621,563

[22] Filed: Mar. 25, 1996

Related U.S. Application Data

[63] Continuation-in-part of Ser. No. 420,844, Apr. 10, 1995, which is a continuation of Ser. No. 60,406, May 11, 1993, Pat. No. 5,422,514.

[51] Int. Cl.[6] .......................... H01L 23/34; H01L 23/02; H01L 23/28
[52] U.S. Cl. .......................... 257/723; 257/679; 257/787; 257/773; 257/685
[58] Field of Search ..................... 257/723, 679, 257/773, 787, 767, 685

[56] References Cited

U.S. PATENT DOCUMENTS

| 4,549,200 | 10/1985 | Ecker et al. | 257/679 |
|---|---|---|---|
| 5,027,190 | 6/1991 | Haghiri-Tehrani et al. | 257/679 |
| 5,239,198 | 8/1993 | Lin et al. | 257/787 |
| 5,422,514 | 6/1995 | Griswold et al. | 257/679 |
| 5,608,261 | 3/1997 | Bhattacharyya et al. | 257/723 |

FOREIGN PATENT DOCUMENTS

| 56-155556 | 12/1981 | Japan | 257/787 |
|---|---|---|---|
| 4-252057 | 9/1992 | Japan | 257/679 |

*Primary Examiner*—Mahshid D. Saadat
*Assistant Examiner*—Jhihan B. Clark
*Attorney, Agent, or Firm*—D'Alessandro & Ritchie

[57] ABSTRACT

A thin MCM packaging structure and technique is provided in which a thin film decal interconnect circuit is fabricated on a thin aluminum wafer. The thin-film decal interconnect employs Au metallurgy for bonding and comprises a bond pad/ground plane layer, topside pads, and one or more routing layers. The top routing layer also acts as the pad layer along the edge of the interconnect structure. The underside of the decal interconnect structure is provided with metal pads for attachment to conventional aluminum or gold I/O pads on one surface of the integrated circuit die. A thermosonic bonding system is used to bond the die pads to the pads. The aluminum wafer is selectively removed forming one or more cavities to hold one or more die to be mounted on the MCM structure. The die are oriented with their pads in contact with contact pads on the thin-film decal interconnect to which they are bonded and the cavities are filled with a liquid encapsulant and cured. A leadframe has inner bond leads electrically bonded to bonding pads of the thin film multilayer interconnect circuit disposed about a periphery thereof and a multi-layer laminate board is mechanically bonded over the thin film multilayer interconnect circuit and over the inner bond leads of the lead frame and has a first layer including conductive pads extending outward from about an inner periphery thereof, and a second layer including apertures aligned with outwardly extending portions of the conductive pads.

36 Claims, 8 Drawing Sheets

PACKAGING AND INTERCONNECT SYSTEM FOR INTEGRATED CIRCUITS

RELATED APPLICATIONS

This application is a continuation-in-part of application Ser. No. 08/420,844, filed Apr. 10, 1995, which is a continuation of application Ser. No. 08/060,406, filed May 11, 1993, now U.S. Pat. No. 5,422,514.

BACKGROUND OF THE INVENTION

1. Field of the Invention

The present invention relates to integrated circuit technology. More specifically, the present invention relates to a packaging and interconnect system for integrated circuits.

2. The Prior Art

Multi-chip modules (MCM) comprising a plurality of integrated circuit dice mounted on a single carrier substrate and a package which provides an interconnect and support function are known in the art. Their use has increased substantially in recent years, and there is an increasing number of applications for MCM technology. The development of MCM devices has required the co-development of suitable mounting and connection technologies. There have been several prior art solutions used to mount and connect die to MCM devices.

According to one prior art approach to mounting a plurality of integrated circuit die on a single MCM substrate, a first multilayer interconnect circuit for interconnecting a plurality of integrated circuit die comprises alternating layers of an insulating material and metal lines and is formed on a first aluminum wafer. The first aluminum wafer carrying the first multilayer interconnect circuit is bonded to a stainless steel circumferential support ring. The first aluminum wafer is etched away, leaving the multilayer interconnect circuit supported by the stainless steel circumferential support ring.

If necessary due to interconnect density, a second multilayer interconnect circuit for interconnecting a plurality of integrated circuit die may be formed on a second aluminum wafer. The second aluminum wafer is bonded to the bottom of the first multilayer interconnect circuit. The second aluminum wafer is then etched away leaving the first and second multilayer interconnect circuits supported by the stainless steel circumferential support ring. Windows for the die to be mounted are cut in the multilayer interconnect circuits and a copper baseplate is bonded to the interconnect circuits. The support ring is then excised from the circuit layers and the die are then mounted on the copper baseplate containing the first and second multilayer interconnect circuits. The die are connected to the interconnect circuitry and to the MCM I/O pads using conventional TAB or wire bonding techniques.

As will be appreciated by those of ordinary skill in the art, this approach requires the use of a separate support ring which must be mated with the assembly in a discrete processing step, and yet another step is required to bond the interconnect circuit to the baseplate. In addition, the mounting of the integrated circuit die directly on the baseplate through apertures formed in the interconnect circuitry layer requires the additional step of forming the apertures prior to bonding the die on the baseplate. The die apertures also consume valuable space which could be used to route circuit traces.

According to another prior-art approach for mounting a plurality of integrated circuit die on a single MCM substrate, a multilayer thin-film interconnect circuit is deposited onto a quartz substrate. The die are then bonded to the thin film interconnect circuit and a circumferential ceramic support ring is bonded to the assembly. The quartz substrate is then removed by etching. Reach-through vias are etched in the thin film circuit to expose the I/O pads on the die and a die interconnect metal layer is formed and defined to interconnect the integrated circuit die. While this solution is useful for MCM technology, it is limited to small circuits and is not reworkable to recover yield losses.

Still another related approach, relating to die testing rather than to permanent MCM mounting techniques, is disclosed in U.S. Pat. No. 5,123,850 to Elder et al. This patent teaches the use of an interconnect circuit formed in a resilient membrane to make temporary electrical contact with pads disposed on a die. The interconnect circuit is formed from alternating layers of polyimide dielectric and metal signal lines. Electrical contact pads protrude from a top surface of the membrane and make electrical contact with individual signal lines. A semiconductor die is placed on the membrane and is aligned by visible means to ensure that the contact pads are disposed opposite pads on the die. An insert plate is placed against a bottom surface of the membrane opposite the die. The interconnect circuit is wire bonded to a pin grid array (PGA) which can be plugged into a test socket base to communicate test signals to and from the carrier. A heat sink is clipped to the PGA, and the die is pressed between the heat sink and the membrane. The force exerted against the die is expected to cause the contact pads to make electrical contact with the die pads.

While earlier chip testing carriers such as the one described above contain good design concepts there have been shortcomings with their use. For example, the gold coated pads on the contact pads often do not make adequate contact with the die pads because of the build-up of an oxide layer on the aluminum die pads.

BRIEF DESCRIPTION OF THE INVENTION

According to a first embodiment of the invention, a thin MCM packaging structure and technique is provided. A thin film multilayer interconnect circuit is fabricated on a thin aluminum wafer. According to a presently preferred embodiment, the thin-film interconnect employs a first layer of Au metallurgy for bonding and comprises a bond pad/ ground plane layer. The fabrication process follows with one or more routing layers and a topside pad layer along the edge of the interconnect structure. The first layer of the interconnect structure is provided with metal pads for attachment to conventional aluminum or gold I/O pads on one surface of the integrated circuit die. A thermosonic or other known available bonding system is used to bond the die pads to the interconnect structure pads.

The aluminum wafer is selectively removed forming one or more cavities. A plasma etch step is used to etch the polyimide material inside the cavity to expose the bonding pads. The cavities are used to hold one or more die to be mounted on the MCM structure. The resulting structure is referred to as a decal. The die are oriented with their pads in contact with contact pads on the thin-film decal interconnect to which they are then electrically connected using one of several available decal-to-die bonding processes, such as thermosonic bonding, or by use of other technologies such as solder ball reflow, gold to gold with adhesive attach, and particle impregnated bump to aluminum pad with adhesive attach. The cavities are then filled with a liquid encapsulant and cured. The composite structure may be lapped down to minimize overall package thickness and to expose the backsides of the integrated circuit die for thermal management.

According to a second embodiment of the present invention, one or more die may be mechanically bonded to the thin-film decal interconnect inside the previously formed cavity or cavities with their metal pads disposed on the die surface opposite the surface bonded to the decal. The pads of the one or more die are connected to the bonding pads of the thin-film decal interconnect by wire bonding technology. The cavity or cavities are filled with a liquid encapsulant and cured. As those of ordinary skill in the art will appreciate, the composite structure of this embodiment may not be lapped due to potential damage to the wire bonds caused by the lapping process.

According to a third embodiment of the present invention, one or more first die are oriented with their pads in contact with contact pads on a first surface of the thin-film decal interconnect inside the previously formed cavity or cavities, to which they are thermosonically bonded using a novel backside-through-via decal-to-die bonding process or by use of other technologies such as solder ball reflow, gold to gold with adhesive attach, and particle impregnated bump to aluminum pad with adhesive attach. After the cavity or cavities are filled with a liquid encapsulant and cured, one or more second die may be mechanically bonded to a second surface of the thin-film decal interconnect with their metal pads on the surface opposite the bonding surface. The pads of the one or more second die are then electrically connected to the decal pads using one of several available decal-to-die bonding processes, such as thermosonic bonding, solder ball reflow, or other techniques.

According to a fourth embodiment of the present invention, one or more first die may be mechanically bonded to a first surface of the thin-film decal interconnect inside the previously formed cavity or cavities, with their metal pads disposed on the surface opposite the surface mechanically bonded to the first surface of the interconnect structure. The pads of the one or more first die are connected to the bonding pads of the thin-film decal interconnect by wire bonding technology. After the cavity or cavities are filled with a liquid encapsulant and cured, one or more second die may be mechanically bonded to a second surface of the thin-film decal interconnect with their metal pads disposed on the surface opposite the surface mechanically bonded to the second surface of the thin-film decal interconnect. The pads of the one or more second die are then connected to the bonding pads of the thin-film decal interconnect by wire bonding technology.

According to a fifth embodiment of the present invention, one or more first die may be mechanically bonded to a first surface of the thin-film decal interconnect inside the previously formed cavity or cavities, with their metal pads disposed on the surface opposite the surface mechanically bonded to the first surface of the interconnect structure. The pads of the one or more first die are connected to the bonding pads of the thin-film decal interconnect by wire bonding technology. After the cavity or cavities are filled with a liquid encapsulant and cured, one or more second die may be mechanically bonded to a second surface of the thin-film decal interconnect with their metal pads disposed on the surface opposite the surface mechanically bonded to the second surface of the thin-film decal interconnect. The pads of the one or more second die are then connected to the bonding pads of the thin-film decal interconnect by wire bonding technology.

A lead frame is bonded to metal pads on the second surface of the thin-film decal interconnect located near the periphery of the MCM structure. The lead frame is used to make power and signal connections to the dice in the MCM structure. This embodiment of the present invention allows electrical access to the dice through traditional lead frame interconnect and electrical access to the dice though a novel interconnect structure on the second surface of the thin film structure. A multi-layer laminate board with interconnect traces is mechanically bonded to the second surface of the thin film decal over the leadframe inner bond leads. The multi-layer laminate board interconnect traces are electrically connected to selected contact pads on the top surface of the thin film decal by wirebonding technology. The multi-layer laminate board creates a cavity on the top side of the decal. The cavity is filled with liquid encapsulant and cured.

The multi-layer laminate board is made from two laminate layers mechanically bonded together with epoxy. The lower layer is made from a laminate material with plated interconnect pads and traces. The upper board layer is made from laminate material with holes mechanically drilled through the laminate. These two layers are aligned so that the holes in the upper laminate layer allow access to the plated interconnect pads on the lower laminate layer.

On the completed structure/package, electrical signal, power, and ground connections to the dice are made through the leadframe. The mechanical and electrical connection of the multi-layer laminate board allows additional electrical access to the dice in the finished package. The additional electrical access is made from the top of the package (the second surface side of the thin film decal) through the mechanically drilled holes in the upper laminate layer, to the plated interconnect pads and traces in the lower laminate board. Electrical contact with the lower laminate board pads and traces are made by conventional electrical test system probes.

A unique feature of the MCM packaging technique of the fifth embodiment of the present invention is the electrical access through the lead frame contact points provided for purposes such as programming and erasing an EEProm or other memory components in an encapsulated package, while making all traditional surface mount leads of the package available for I/O, power, and ground connection to other components or the next level of interconnect. This encapsulated package can be designed to mimic a number of industry-wide package standard outlines and lead frames.

In the above-described embodiments of the present invention, the second surface of the thin film decal can also be used to attach the I/O connectors, such as lead frames, solder balls, etc., thus permitting a dense, high-performance structure.

Those of ordinary skill in the art will recognize the several advantages of the present invention over the prior art MCM structures and mounting techniques. First, the present invention provides a greater die packing density because inter-die spacings are small and both sides of the interconnect circuitry can be used for components and connectors. In addition, the packaging technique of the present invention presents a small form factor, since the package-to-board connection area can be much smaller, i.e., a land grid array. The cost of providing complex packaging and interconnect circuits is also reduced. Also, the present invention provides high-performance circuits because of the short interconnect distances between the dice and between individual die and the decal.

The present invention also provides processing advantages since, after etching, the aluminum wafer is used to perform the function of the support ring, the process steps associated with bonding and excising the support ring are eliminated. In addition, because the die are mounted directly on the thin-film decal interconnect, the steps of defining apertures through the interconnect layer and bonding the die onto the copper baseplate are eliminated.

According to a sixth embodiment of the present invention, one or more first die are oriented with their pads in contact with contact pads on a first surface of the thin-film decal interconnect inside the previously formed cavity or cavities, to which they are thermosonically bonded using a novel backside-through-via decal-to-die bonding process or by use of other technologies such as solder ball reflow, gold to gold with adhesive attach, or particle impregnated bump to aluminum pad with adhesive attach. Additionally, one or more second die are mechanically bonded to a second surface of one or more first die, the second surface being opposite to the first surface of the thin-film decal interconnect. The one or more second die having metal pads that are connected to the bonding pads on the first surface of the thin-film decal interconnect by wire bonding technology.

The cavity or cavities are filled with a liquid encapsulant and cured. After curing, one or more third die are mechanically bonded to the second surface of the thin-film decal interconnect. The one or more third die have metal pads oriented on a surface opposite the second surface of the decal interconnect. The metal pads are connected to bonding pads of the thin-film interconnect by wire bonding technology.

According to a seventh embodiment, the one or more third die in the above paragraph have metal pads disposed on a surface facing the second surface of the thin-film decal interconnect and oriented so that the metal pads contact with the contact pads on the second surface of the thin-film decal interconnect. The oppositely facing pads are bonded together by technologies such as solder ball reflow, gold to gold with adhesive attach, or particle impregnated bump to aluminum pad with adhesive attach.

According to an eight embodiment, one or more first die are oriented with their pads in contact with contact pads on a first surface of the thin-film decal interconnect inside the previously formed cavity or cavities, to which they are thermosonically bonded using a novel backside-through-via decal-to-die bonding process or by technologies such as solder ball reflow, gold to gold with adhesive attach, and particle impregnated bump to aluminum pad with adhesive attach. After the one or more first die are thermosonically bonded, one or more second die are mechanically bonded to a second surface of the one or more first die, the second surface being opposite the surface thermosonically bonded to the first surface of the thin-film decal interconnect. The one or more second die have metal pads that are connected to the bonding pads of the thin-film decal interconnect by wire bonding technology.

The cavity or cavities are filled with a liquid encapsulant and cured. After curing, one or more third die are oriented with their pads in contact with contact pads on a second surface of the thin-film decal interconnect, to which they are bonded using technologies such as, but not limited to, solder reflow, gold to gold with adhesive attach, or particle impregnated bump to aluminum pad with adhesive attach. Also, one or more fourth die are mechanically bonded to a second surface of the one or more third die, the second surface being opposite the second surface of the thin-film decal interconnect. The one or more fourth die have metal pads that connected to the bonding pads of the thin-film decal interconnect by wire bonding technology.

DETAILED DESCRIPTION OF A PREFERRED EMBODIMENT

Figure 1A:
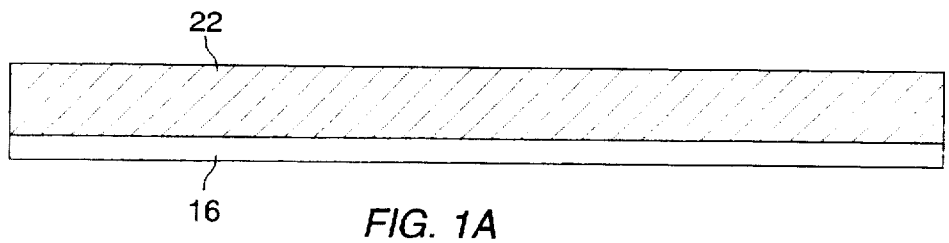
FIGS. 1a–1e are cross sectional views of a multichip module assembly according to a first embodiment of the present invention.

Those of ordinary skill in the art will realize that the following description of the present invention is illustrative only and not in any way limiting. Other embodiments of the invention will readily suggest themselves to such skilled persons.

Referring first to FIGS. 1a–1e, an illustrative MCM device 10 according to a first embodiment of the present invention is shown in cross section during various stages of its fabrication. The illustrative example depicted in FIGS. 1a–1e includes two integrated circuit die 12 and 14 mounted on a thin-film decal interconnect structure 16 in cavities 18 and 20 formed in an aluminum baseplate 22 to form a support frame 24. While the disclosure herein is directed to an aluminum baseplate, those of ordinary skill in the art will readily recognize that other materials, such as silicon or copper, may also be used to form baseplate 22.

Those of ordinary skill in the art will recognize that an arbitrary number of integrated circuits, limited only by the ability to provide sufficient interconnect capability in the thin-film decal interconnect structure 16, may be mounted in the MCM device of the present invention.

The I/O connections of the integrated circuit die 12 and 14 in the MCM module of FIGS. 1a–1e are in the form of conductive pads, typically aluminum or gold, on the surfaces of the die 12 and 14 in contact with the thin-film decal interconnect structure 16 and are electrically connected to the thin-film decal interconnect structure 16 by thermosonic bonding techniques.

FIG. 1a shows the structure after the thin-film decal interconnect structure 16 has been formed on the aluminum baseplate 22 using known fabrication techniques. According to a presently preferred embodiment baseplate 22 may comprise an aluminum wafer having a thickness of about 50 mils. For ease in understanding the figure, the details of the thin-film decal interconnect structure 16 have been omitted and will be disclosed in subsequent figures herein. For the purposes of FIGS. 1a–1e, it is sufficient to understand that the thin-film decal interconnect structure 16 comprises a bonding pad/ground plane layer as the first metal layer fabricated on top of the aluminum baseplate 22, and one or more routing layers insulated therefrom and from one another.

Figure 1B:
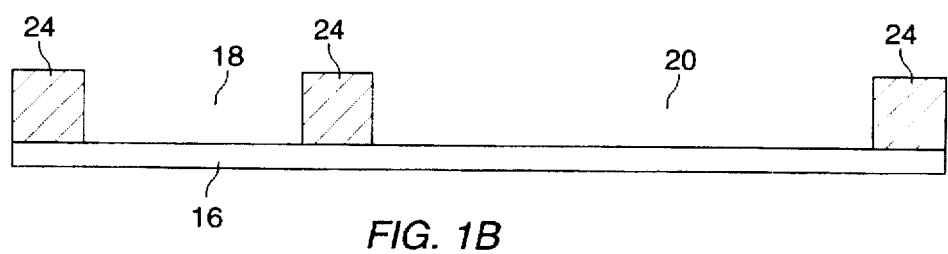

Referring now to FIG. 1b, portions of the aluminum baseplate 22 have been removed to form cavities 18 and 20 in a support frame 24. The removal of aluminum from baseplate 22 to form support frame 24 is preferably accomplished through a combination of mechanical and chemical processes. The aluminum is first partially removed by milling and the remainder is then chemically etched. This etching step may be performed using an etching process which is reactive to aluminum but not reactive to the polymer material at the surface of the thin-film decal interconnect structure 16. A presently preferred etching process comprises hydrochloric acid.

Before the die 12 and 14 are positioned in the cavities 18 and 20, the polymer surface of the thin-film decal interconnect structure 16 is etched to expose contact bonding pads for interconnecting to the pads on the surface of the die to be placed in contact with the thin-film decal interconnect structure 16. The polymer surface is blanket etched using a plasma etch process.

Figure 1C:
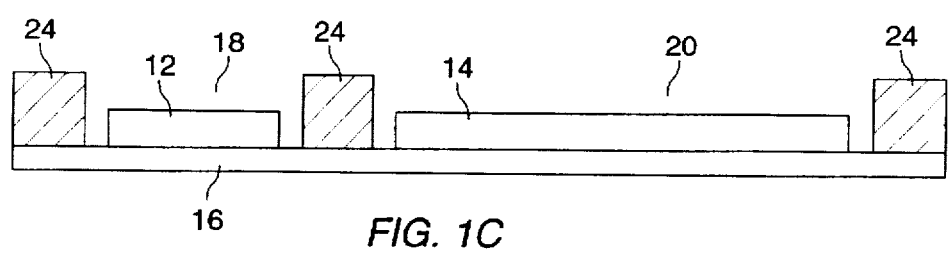

Referring now to FIG. 1c, die 12 and 14 are placed in cavities 18 and 20 within support frame 24 and positioned such that their I/O pads are aligned with the exposed contact pads of the thin-film decal interconnect structure. The die are then bonded to the contact pads using conventional thermosonic bonding techniques through the bottom of the thin-film decal interconnect structure 16.

Figure 1D:
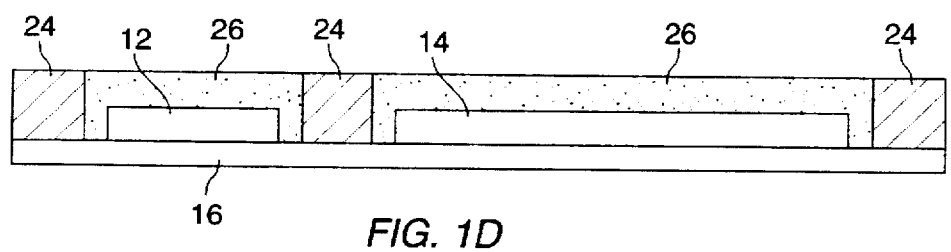

As shown in FIG. 1d, after the die 12 and 14 have been bonded to the thin-film decal interconnect structure 16, the remainder of the volumes of cavities 18 and 20 within support frame 24 are filled under vacuum with a liquid encapsulant, such as epoxy (shown at reference numeral 26), which is then cured as is known in the art. The structure is essentially complete.

Figure 1E:
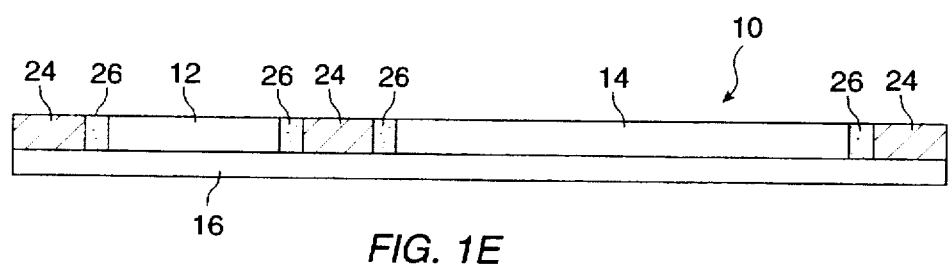

The die attach to the decal cavity can also be accomplished by a solder ball reflow approach. In this case, solder balls are deposited on the die and are reflowed to the metal pads on the decal. The solder ball material can be high lead, eutectic or other kind of solder materials and the metal pads on the decal can be copper, nickel, solder and other solderable material. Once reflowed, the cavity and the die are filled and underfilled with epoxy and other suitable materials to seal the die and to provide the structure integrity. As will be appreciated by those of ordinary skill in the art, electrical connection to the I/O pads on the die can be made by use of other known technologies, such as gold to gold with adhesive attach, and particle impregnated bump to aluminum pad with adhesive attach As shown in FIG. 1e, the composite structure may be lapped, if necessary, to minimize the overall package thickness and to expose the backsides of the die 12 and 14 for thermal management purposes. Once the backsides of the die have been exposed, some form of heat sink structure (not shown) may be thermally coupled to the exposed die surfaces as is well known in the art.

The finished MCM module of FIG. 1e, with one or more dice attached to the substrate, can be attached to the next level of interconnect such as a PWB, a flex or a hybrid board etc. with the BGA approach. Namely, a set of solder balls are deposited on the metal pads on the front side of the substrate and reflowed to bond to the pads. The resultant unit will be a single chip or a multichip module. When ready, the module is reflowed to the next level of interconnect with another reflow step. Obviously, other means to attach the module to the next level of interconnect includes leadframe, wire bond, adhesive bond etc.

Figure 2A:
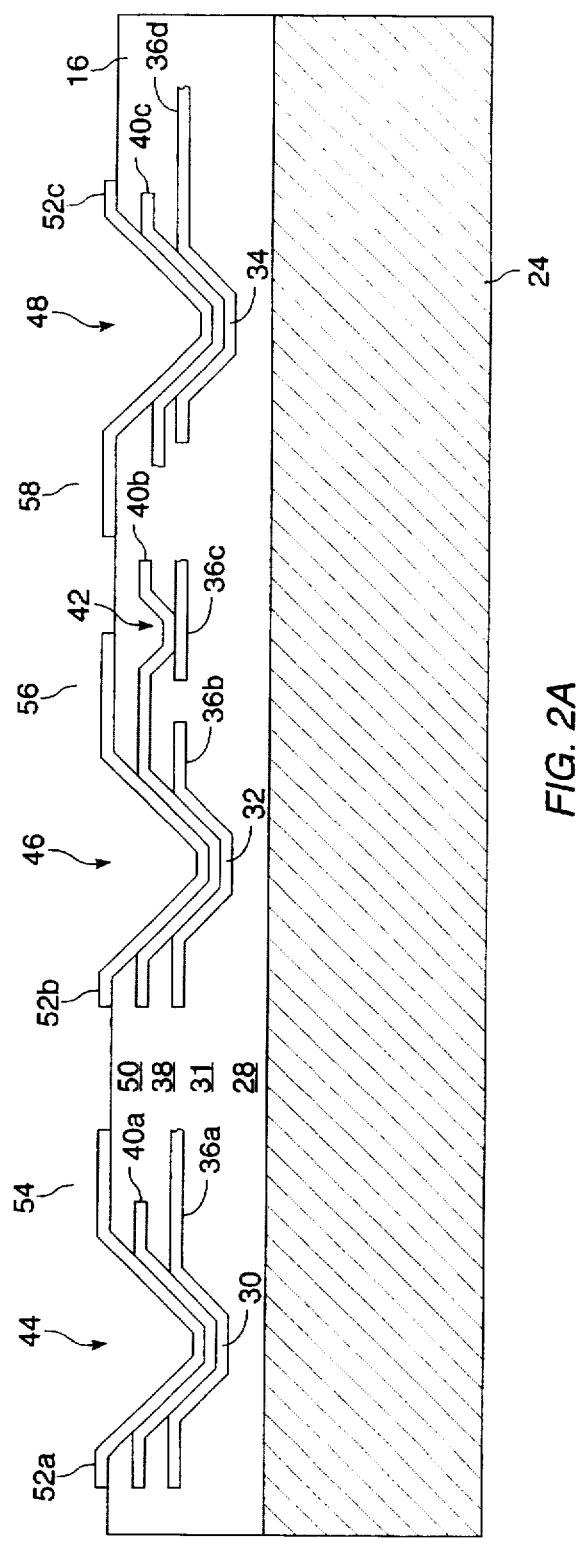
FIGS. 2a to 2c are more detailed cross sectional views of a portion of the thin-film decal interconnect structure and aluminum frame substrate used in the multichip module assembly according to the present invention, showing details of the decal structure after selected processing steps used in the assembly.
Figure 2B:
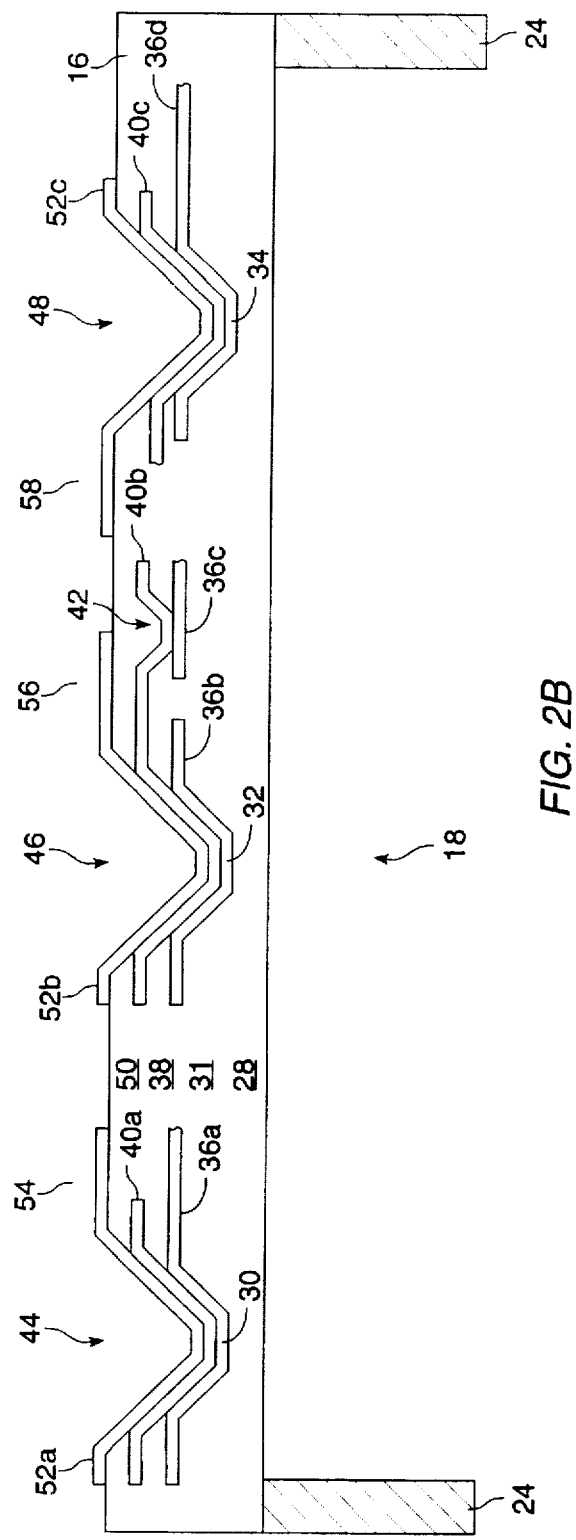
Figure 2C:
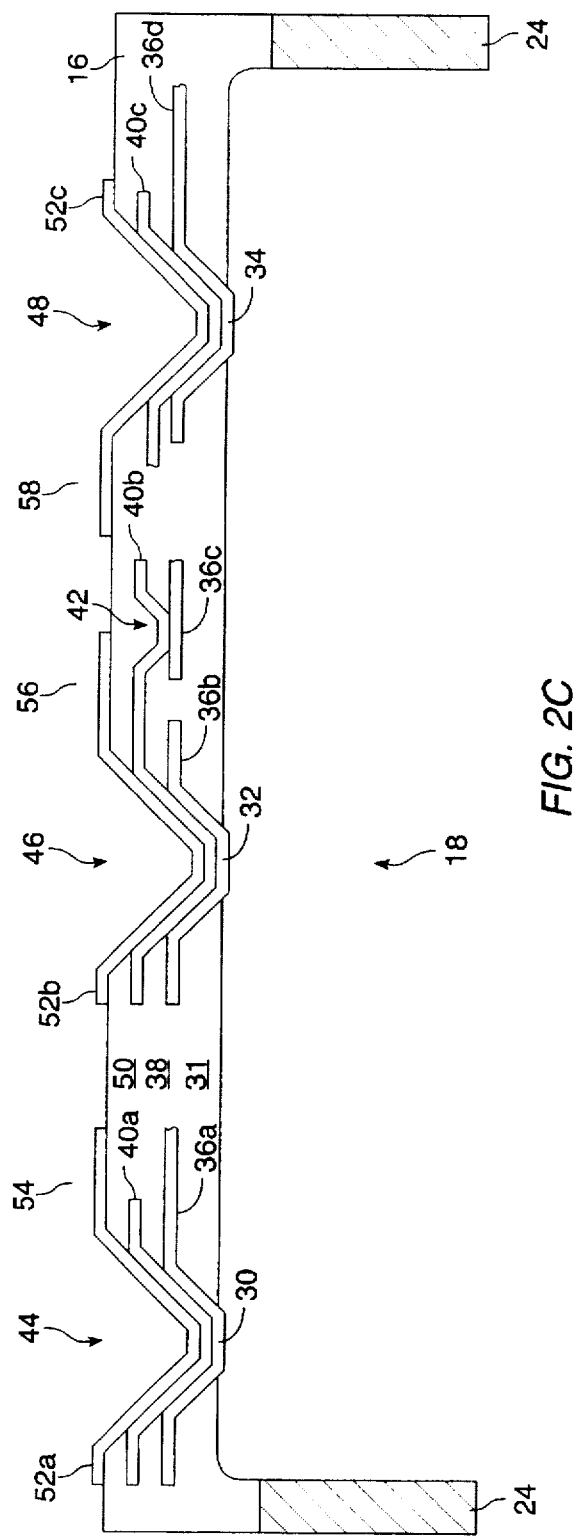

As previously mentioned, the thin-film decal interconnect structure 16 is initially disposed on the aluminum baseplate 22 which is used to form support frame 24. FIGS. 2a–2c are more detailed cross sectional views of the thin-film decal interconnect structure 16 and support frame 24. As may be seen from FIG. 2a, the thin-film decal interconnect structure 16 comprises several metal layers separated by insulating layers. More particularly, thin-film decal interconnect structure 16 is formed on an aluminum substrate which will become support frame 24 by the process described with reference to FIG. 1b. The embodiment disclosed herein is an illustrative embodiment employing polyimide material for the body of thin-film decal interconnect structure 16, but those of ordinary skill in the art will recognize that other materials will function in its place. In a typical embodiment of the present invention, thin-film decal interconnect structure 16 will have A thickness on the order of 1 to 2 mils.

The formation of the thin-film decal interconnect structure 16 is briefly described herein. Those of ordinary skill in the art will understand how to form such a structure. The formation of an illustrative the thin-film decal interconnect structure 16 is disclosed in co-pending application Ser. No. 07/979,719, filed Nov. 20, 1992, now U.S. Pat. No. 5,402, 077, assigned to the same assignee as the present invention. This application is expressly incorporated herein by reference. However, a brief description of the fabrication of thin-film decal interconnect structure 16 will aid those of ordinary skill in the art in understanding the present invention.

A first polyimide layer shown generally in the horizontal region of the entire structure defined at reference numeral 28 is first formed on the upper surface of aluminum substrate 22. First polyimide layer 28 will typically have a thickness of about between 1 and 2 microns. A first metal layer, forming contact pads 30, 32, and 34 is defined using conventional metal deposition and definition techniques. The first metal layer will typically have a thickness in the range of 2 to 10 microns and may comprise a metal such as gold or copper. A second layer of polyimide 31 having a thickness of between about 12–24 microns is then deposited on the entire substrate surface. Contact vias for contact pads 30, 32, and 34 are then formed using conventional etching technology.

A second metal layer is deposited by conventional sputtering and plating steps to form metal interconnect conductors 36a, 36b, 36c, and 36d. Metal interconnect conductors 36a, 36b, and 36d are shown making contact to contacts 30, 32, and 34, while interconnect conductor 36c is not shown making connections between circuit nodes disposed in the structure, those of ordinary skill in the art will appreciate that such connections are made by the various interconnect conductors. Contact pads 30, 32, and 34 will be used as bonding sites for the I/O connections of the die to be attached to the thin-film decal interconnect structure 16 by the backside-through-via thermosonic bonding technique of the present invention.

A third polyimide layer (shown generally in the horizontal region of the entire structure defined at reference numeral 38) is formed to cover the first metal interconnect layer and second metal layer interconnect conductors 36a, 36b, 36c, and 36d. The third polyimide layer 38 acts as an inter-metal dielectric layer and may typically range in thickness from about 12 to 24 microns. Contact vias are formed in the third polyimide layer for connections to be made between the second metal interconnect layer and a third optional metal interconnect layer (which may be employed if needed) or a contact pad layer on the top surface of decal 16.

If employed, a third metal layer comprising an additional interconnect layer comprising interconnect conductors 40a, 40b, and 40c is formed using conventional metal deposition and definition techniques. Those of ordinary skill in the art will appreciate that an illustrative inter-metal via shown generally at reference numeral 42 is used to connect interconnect conductor 36c in the second metal layer to interconnect conductor 40b in the third metal layer. If employed, the third metal interconnect layer will typically have a thickness in the range of 4 microns and may comprise a metal such as copper.

According to a presently preferred embodiment of the invention, backside bonding vias 44, 46, and 48 are provided in order to accomplish the backside-through via bonding technique of the present invention. As presently preferred, apertures for bonding vias 44, 46, and 48 are present in the masking layers which define the interlayer vias in the structure such that segments of interconnect conductors 40a, 40b, and 40c of the third metal layer are deposited in bonding vias 44, 46, and 48 to strengthen contacts 30, 32, and 34, although this may not be necessary for all embodiments of the present invention.

A fourth polyimide layer (shown generally in the horizontal region of the structure at reference numeral 50) is formed to cover the interconnect conductors of the third metal layer. Inter-metal vias are formed at selected locations to make contact, if required, to selected circuit nodes in the third metal interconnect layer, and to re-open bonding vias 44, 46, and 48 in a preferred embodiment of the invention. The fourth polyimide layer 50 may typically range in thickness from about 12 to 24 microns. Contact vias are formed in the fourth polyimide layer for connections to be made between interconnect conductors in the third metal layer and a contact pad layer on the top surface of decal 16.

A fourth metal layer is deposited and defined over the surface of fourth polyimide layer 50 to form conductor segments 52a, 52b, and 52c. Conductor segments 52a, 52b, and 52c may be used as an additional interconnect layer if desired, and also provide contact pads 54, 56, and 58, which will be used to make electrical connections between the MCM module and a printed circuit board to which it will be connected. The fourth metal layer may have a thickness of from about 10 to about 20 microns, and may comprise a metals such as copper, nickel, and gold, or solder. FIG. 2a shows the structure existing after all of these steps have been performed.

Those of ordinary skill in the art will recognize that the pads 54, 56, and 58 may be a portion of a large area array of contact pads. The use of an area array of contact pads permits the mounting of the MCM to a printed circuit board using solder ball, fuzz button, or other techniques, resulting in all of the interconnections between the MCM assembly and the circuit board to be under the MCM assembly. Because none of the area immediately surrounding the MCM is needed for MCM-to-board interconnect as when other interconnect schemes, such as lead frames are employed, a more densely packed circuit board assembly is possible using the present invention.

Referring now to FIG. 2b, after the steps necessary for the formation of the decal 16 shown in FIG. 2a have been performed, one or more cavities (illustrative cavity 18 is shown in FIG. 2b) are etched in baseplate 22 to expose the lower surface of decal 16 and to form support frame 24. As previously disclosed, cavity 18 may be preferably be formed using a two-step process in which the aluminum is first partially removed by milling and the remainder is then chemically etched. This etching step may be performed using an etching process which is reactive to aluminum but not reactive to the polymer material at the surface of the thin-film decal interconnect structure 16. A presently preferred etching process comprises hydrochloric acid.

Referring now to FIG. 2c, the structure of the decal is shown after the steps used to expose contact pads 30, 32, and 34 in cavity 18 in support frame 24. Polyimide layer 28 is etched back to expose a portion of the thicknesses of contact pads 30, 32, and 34 in preparation for bonding the integrated circuit die to the decal 16 in cavity 18. Typically, a thickness of about 3 to 5 microns may be removed to expose about 2 to 4 microns of the height of contact pads 30, 32, and 34.

Figure 2D:
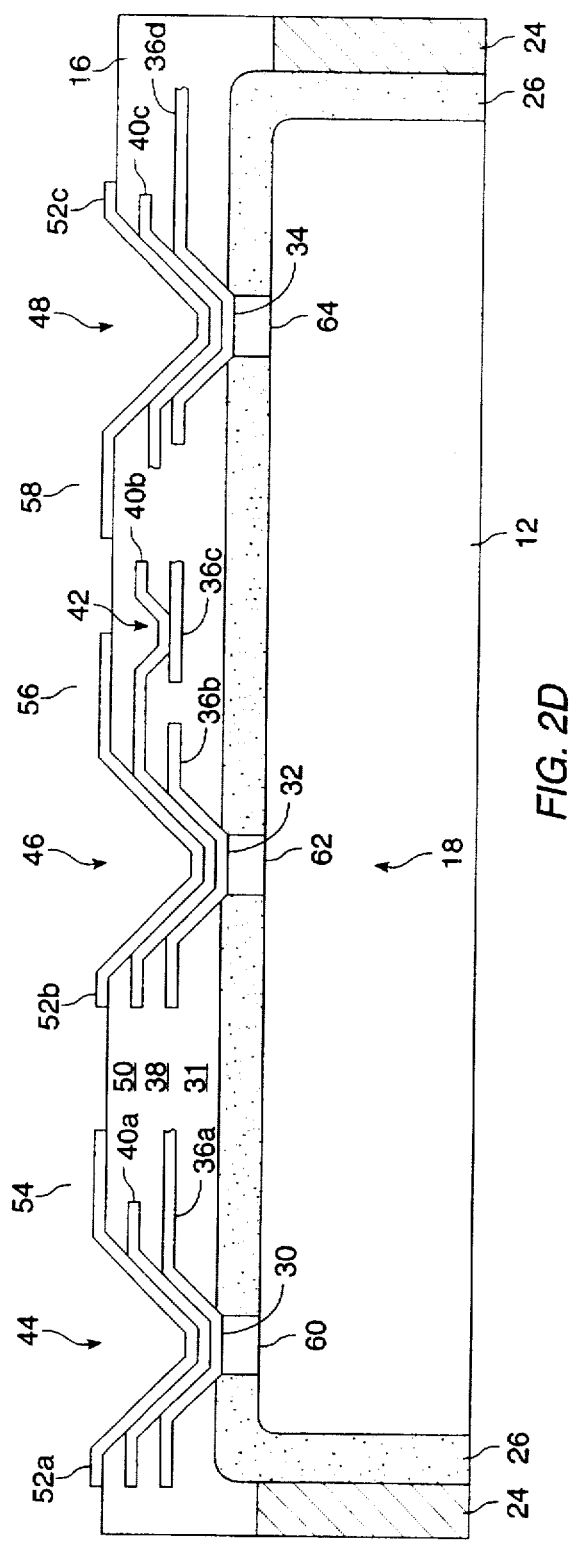
FIG. 2d is a cross-sectional view of a portion of the thin-film decal interconnect structure of FIG. 2c and a portion of an integrated circuit die backside-through-via bonded thereto, showing the decal to die bonding in more detail.

Referring now to FIG. 2d, an integrated circuit die 12 is shown mounted in cavity 18 with its I/O pads 60, 62, and 64, shown bonded to contact pads 30, 32, and 34, respectively. The bonding of integrated circuit die to decal 16 may be accomplished according to an aspect of the present invention referred to as backside-through-via bonding. FIG. 2d also shows the liquid encapsulant 26, which has been introduced under vacuum and then cured as is known in the art. The structure of FIG. 2d is essentially complete and resembles the structure of FIG. 1e but in more detail.

The backside-through-via bonding process of the present invention uses conventional thermosonic wirebonding equipment. However, wire is not used. Instead, a tool, such as a titanium carbide single point TAB bonding tool, part No. 1152-010003-437GM, available from Gaiser Tool Company of Ventura, Calif., is used in the bonding head to effect the through-via bond. The design geometry of such a tool has been optimized to provide the best bonding strength. The equipment setup parameters have also been optimized, but are well within the range used by conventional thermosonic wirebonding, but are well within the range used by conventional thermosonic bonding, and would be familiar to anyone of ordinary skill in the art.

Figure 2E:
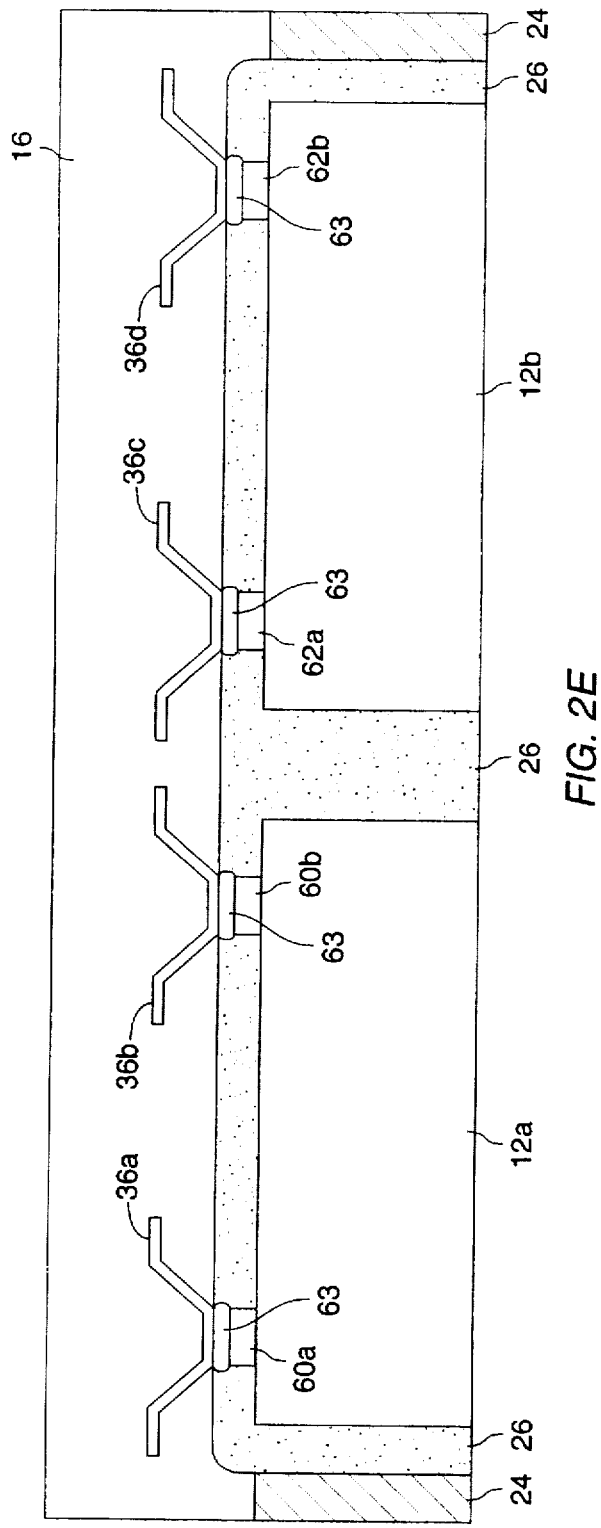
FIG. 2e is a cross-sectional view of a portion of the thin-film decal interconnect structure of FIG. 2c and a portion of an integrated circuit die electrically connected thereto, according to alternate embodiments of the present invention.

Referring now to FIG. 2e, a cross-sectional view is shown of a portion of the thin-film decal interconnect structure of FIG. 2c and a portion of an integrated circuit die electrically connected thereto, to illustrate alternate embodiments of the present invention in which other techniques are used to electrically connect the I/O pads of the integrated circuit die to the connection pads of the thin-film interconnect structure. In FIG. 2e, integrated circuit dice 12a and 12b are shown mounted in cavity 18 with their respective I/O pad 60a is shown electrically connected to contact pad 36a via connection medium 63. I/O pad 60b is shown electrically connected to contact pad 36b via connection medium 63. I/O pad 62a is shown electrically connected to contact pad 36c via connection medium 63, and I/O pad 62d is shown electrically connected to contact pad 36d via connection medium 63. FIG. 2d also shows the liquid encapsulant 26, which has been introduced under vacuum and then cured as is known in the art. The structure of FIG. 2d is essentially complete and resembles the structure of FIG. 1e but in more detail.

Connection medium 63 may comprise one of a number of materials in accordance with this aspect of the present invention. Technologies such as solder ball reflow, gold to gold with adhesive attach, and particle impregnated bump to aluminum pad with adhesive attach may be used. In the case of solder ball reflow, connection medium 63 comprises reflowed solder balls. In the case of gold to gold with adhesive attach, connection medium 63 comprises a thermosonically bonded gold ball and encapsulant 26 comprises a high shrinking fillerless adhesive such as that sold under stock number EP19HT available from Masterbond, Inc. of Hackensack, N.J. In the case of particle impregnated bump to aluminum pad with adhesive attach, connection medium 63 comprises a metal bump, typically Cu or Ni, impregnated with silicon carbide, titanium carbide, boron carbide or tungsten carbide particles. In this embodiment also encapsulant 26 comprises a high shrinking adhesive. These attachment technologies and their use are well known in the art.

According to a second embodiment of the present invention, one or more die may be mechanically bonded to the thin-film decal interconnect with their metal pads disposed on the die surface opposite the surface bonded to the decal. The pads of the one or more die are connected to the bonding pads of the thin-film decal interconnect by wire bonding technology. Such an embodiment is now described with reference to FIG. 3.

Figure 3:
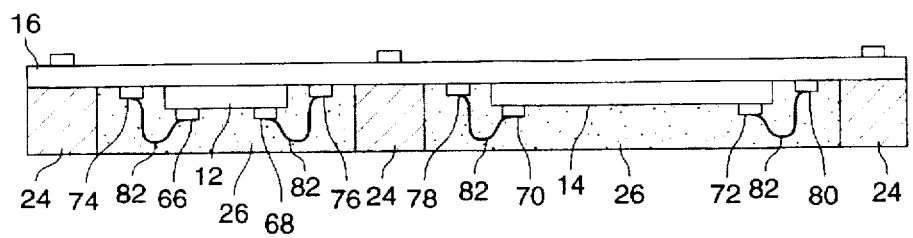
FIG. 3 is a cross sectional view of a portion of a multichip module assembly according to a second embodiment of the present invention.

Referring now to FIG. 3, a simplified cross sectional view of a portion of an illustrative multichip module assembly according to a second embodiment of the present invention is shown. As in the first embodiment of the present invention, decal 16 is disposed on support frame 24. In the embodiment of FIG. 3, the surfaces of integrated circuit die 12 and 14 opposite to the surface containing their I/O pads have been mechanically bonded to the surface of decal 16 by means such as conductive epoxy, and the I/O pads (two illustrative I/O pads 66 and 68 on die 12 and two illustrative I/O pads 70 and 72 are shown on die 14) are connected to contact pads 74 and 76, and 78 and 80 of decal 16 with bond wires 82. As in the embodiment shown in FIGS. 1a–1e and 2a–2d, encapsulant 26 is used to seal the assembly, but the surface is not lapped to prevent damage to bond wires 82 from the lapping process.

Those of ordinary skill in the art will recognize that, like the previously disclosed embodiment, the embodiment of FIG. 3 also includes pads 54, 56, and 58, which may be a portion of a large area array of contact pads, on the surface of decal 16 opposite to the side on which die 12 and 14 are mounted. The use of an area array of contact pads permits the mounting of the MCM assembly of this embodiment of the invention to a printed circuit board using solder ball or other techniques, resulting in all of the interconnections between the MCM assembly and the circuit board to be under the MCM assembly. Thus the embodiment of FIG. 3 also allows dense packing of a circuit board. However, due to the peripheral nature of the wire bond connecting the die 12 and 14 to the decal 16, the embodiment of FIG. 3 does not permit the fabrication of an MCM assembly as dense as does the embodiment of FIGS. 1a–1e and 2a–2d.

Figure 4:
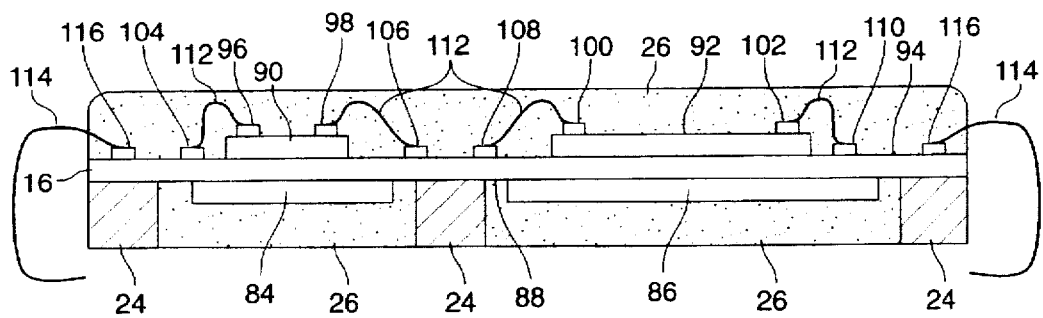
FIG. 4 is a cross sectional view of a portion of a multichip module assembly according to a third embodiment of the present invention.

A third embodiment of the present invention is illustrated in FIG. 4, a cross-sectional view of an MCM assembly. According to this embodiment of the invention, one or more first die 84 and 86 are placed in cavities in support frame 24 and are oriented with their pads in contact with contact pads on a first surface 88 of the thin-film decal interconnect to which they are thermosonically bonded using the novel backside-through-via decal-to-die bonding process described herein and encapsulated with encapsulant 26.

After die 84 and 86 have been bonded to the first surface 88 of decal 16, one or more second die 90 and 92 may be mechanically bonded to a second surface 94 of the thin-film decal interconnect with their metal pads on the surface opposite the bonding surface. The I/O pads 96 and 98 of the second die 90 and the I/O pads 100 and 102 of the second die 92 are then connected to bonding pads 104 and 106, and 108 and 110, respectively, disposed on the second surface 94 of decal 16 around the periphery of die 90 and 92 bond wires 112. Because the second surface 94 of the decal 16 is populated with integrated circuit die, the assembly of FIG. 4 must be connected to a printed circuit board via a peripheral mounting technology, such as a lead frame, shown at reference numeral 114. It therefore does not allow the same degree of I/O density as does the first embodiment of the invention.

Figure 5:
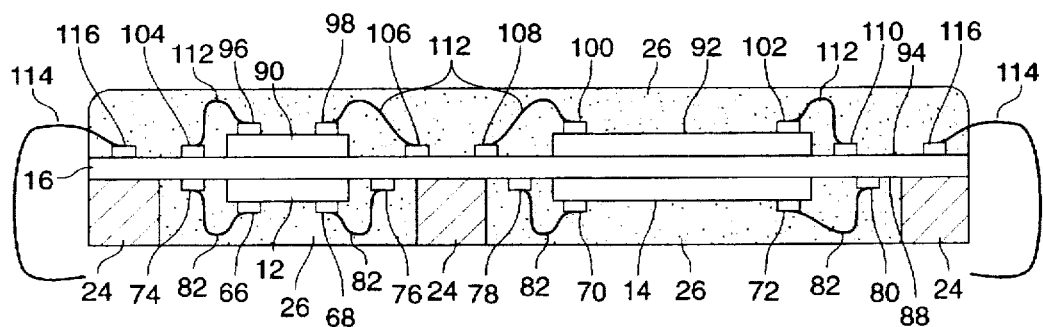
FIG. 5 is a cross sectional view of a portion of a multichip module assembly according to a fourth embodiment of the present invention.

A fourth embodiment of the invention is depicted in FIG. 5, a cross-sectional view of an MCM assembly according to the invention. As in the second embodiment of the present invention, decal 16 is disposed on support frame 24, and integrated circuit die 12 and 14. In the embodiment of FIG. 3, the surfaces of integrated circuit die 12 and 14 opposite to the surface containing their I/O pads are mechanically bonded to first surface 88 of decal 16 by means such as conductive epoxy. The I/O pads 66 and 68 of die 12 and 70 and 72 of die 14 are connected to contact pads 74 and 76, and 78 and 80 of decal 16 on first surface 88 of decal 16 with bond wires 82. As in the embodiment shown in FIG. 3, encapsulant 26 is used to seal the assembly, and the surface is not lapped to prevent damage to bond wires 82 from the lapping process.

As in the embodiment of FIG. 4, FIG. 5 shows that one or more second die 90 and 92 may be mechanically bonded to a second surface 94 of the thin-film decal interconnect with their metal pads on the surface opposite the bonding surface. The I/O pads 96 and 98 of the second die 90 and the I/O pads 100 and 102 of the second die 92 are then connected to bonding pads 104 and 106, and 108 and 110, respectively, disposed on the second surface 94 of decal 16 around the periphery of die 90 and 92 bond wires 112.

Because two sides of the decal are populated with die, the MCM assembly of FIG. 5 allows a high degree of interconnect between the die on both surfaces of the decal, limited only by the fact that all connections to the die must be peripheral. However like the assemblies of FIG. 4, the assembly of FIG. 5 must be connected to a printed circuit board via a peripheral mounting technology, such as a lead frame, shown at reference numeral 114 bonded to contact pads 116, because the second surface 94 of the decal 16 is populated with integrated circuit die. It therefore does not allow the same degree of I/O density as does the first embodiment of the invention, and does not permit the largest density of I/O.

In addition, because the die on both surfaces of decal 16 are electrically connected thereto by wire bonding, those of ordinary skill in the art will recognize that surface lapping of the cured encapsulant endangers the integrity of the wire bond connections. Therefore, it is not recommended and an MCM assembly according to this embodiment of the invention will be thicker than an of the other embodiments.

Figure 6:
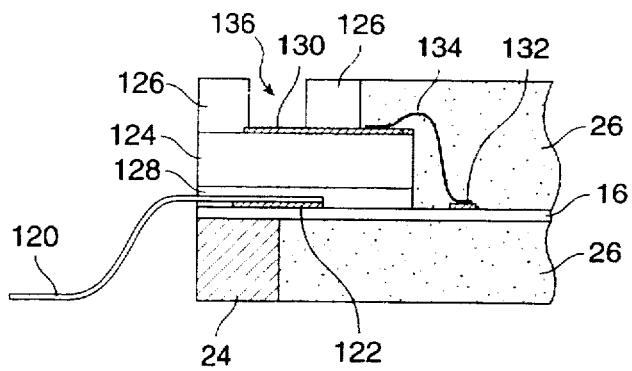
FIG. 6 is a cross sectional view of a portion of a multichip module assembly according to a fifth embodiment of the present invention.

Referring now to FIG. 6, a cross-sectional view of the peripheral portion of an MCM assembly according to a fifth embodiment of the invention is depicted. The embodiment of FIG. 6 is like the embodiment depicted in FIG. 5 and differs therefrom in the details shown in FIG. 6, which shows the elements in a view enlarged with respect to the views of the previous figures in order to show the details of the structural differences between the embodiments of FIGS. 5 and 6.

Where structural elements in FIG. 6 correspond to structural elements of the embodiment of FIG. 5, they will be given the same reference numerals as in FIG. 5. The center of the structure of the embodiment of FIG. 6 is identical to the center of the structure depicted in FIG. 5 and thus details of that portion of the structure will not be repeated here. From FIG. 6, support frame 24 may be seen supporting thin-film decal 16 and epoxy 26 is also shown filling the cavity on the lower surface of thin-film decal 16.

A leadframe 120 is attached to the metal contact pads 122 of the second surface of the thin film decal using thermosonic bonding technology. A multi-layer laminate board, having a lower layer 124 and an upper layer 126, is mechanically bonded to the second surface of the thin film decal over the inner bond leads of the leadframe 120 with an epoxy 128. The multi-layer laminate board includes interconnect pads 130, which are electrically connected to pads 132 on the top surface of the thin film decal by bonded wires 134. The multi-layer laminate board creates a cavity on the top side of the thin-film decal 16 which is filled with liquid encapsulant 26 to seal the assembly.

The lower layer 124 of the multi-layer laminate board is made from a laminate material such as FR-4, BT Resin, or polyimide and interconnect pads 128 are plated thereon from electrically conductive materials (e.g., copper). The upper layer 126 is made from laminate material (e.g., FR-4, BT Resin, Polyimide) with holes 136 mechanically drilled through the laminate. These two layers are mechanically bonded together with epoxy and aligned so that the holes 136 in the upper laminate layer 126 allow access to the plated interconnect pads 130 on the lower laminate layer 124.

On the completed structure/package, electrical signal, power, and ground connections to the dice are made through the leadframe 120. The mechanical and electrical connection of the multi-layer laminate board allows additional electrical access to the dice in the finished package. The additional electrical access is made from the top of the package (the second surface side of the thin film decal 16) through the mechanically drilled holes 136 in the upper laminate layer 126, to the plated interconnect pads and traces in the lower laminate board. Electrical contact with the lower laminate board pads and traces are made by conventional electrical test system probes.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

Figure 7:
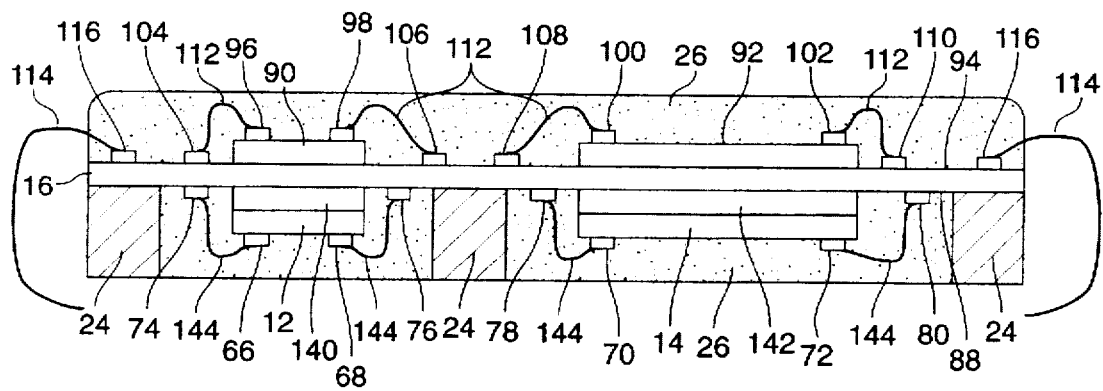
FIG. 7 is a cross sectional view of a portion of a multichip module assembly according to a sixth embodiment of the present invention.

Referring now to FIG. 7, a cross sectional view of an MCM assembly. According to this embodiment of the invention, one or more first die 140 and 142 are placed in cavities in support frame 24 and are oriented with their pads in contact with contact pads on a first surface 88 of the thin-film decal interconnect to which they are thermosonically bonded using the novel backside-through-via decal-to-die bonding process described herein.

After die 140 and 142 have been bonded to the first surface 88 of decal 16, the surfaces of integrated circuit die 12 and 14 opposite to the surface containing their I/O pads are mechanically bonded to a second surface of die 140 and 142 by means such as conductive epoxy. The I/O pads 66 and 68 of die 12 and 70 and 72 of die 14 are connected to contact pads 74 and 76, and 78 and 80, respectively, on first surface 88 of decal 16 with bond wires 144. As in the embodiments shown in FIGS. 3 and 5 encapsulant 26 is used to seal the assembly, and the surface is not lapped to prevent damage to bond wires 144 from the lapping process.

After die 12 and 14 have been bonded to the second surface of die 140 and 142, one or more third die 90 and 92 may be mechanically bonded to a second surface 94 of the thin-film decal interconnect with their metal pads on the surface opposite the bonding surface. The I/O pads 96 and 98 of the third die 90 and the I/O pads 100 and 102 of the third die 92 are then connected to bonding pads 104 and 106, and 108 and 110, respectively, using bond wires 112. The bonding pads are disposed on the second surface 94 of decal 16 around the periphery of die 90 and 92. Because the second surface 94 of the decal 16 is populated with integrated circuit die, the assembly of FIG. 7 must be connected to a printed circuit board via a peripheral mounting technology, such as a lead frame 114.

Figure 8:
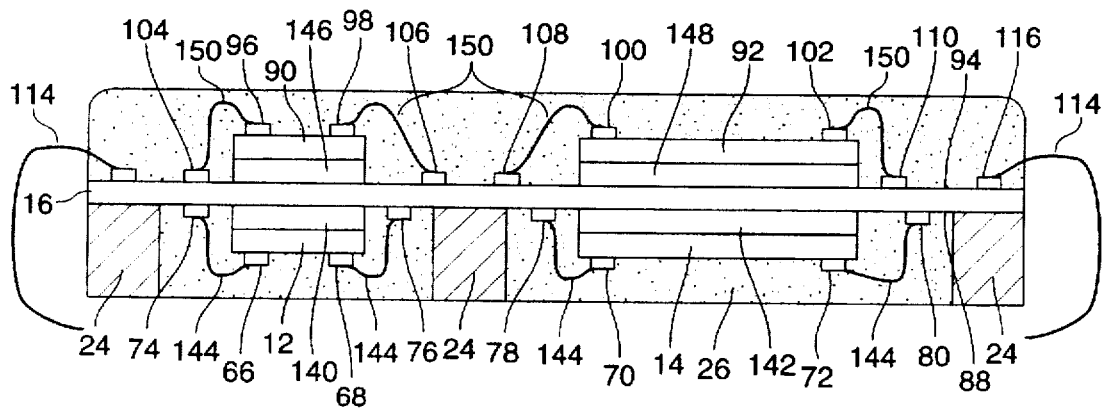
FIG. 8 is a cross sectional view of a portion of a multichip module assembly according to an eighth embodiment of the present invention.

Referring now to FIG. 8, a cross-sectional view of an MCM assembly. As in the embodiment in FIG. 7, one or more first die 140 and 142 are placed in cavities in support frame 24 and are oriented with their pads in contact with contact pads on a first surface 88 of the thin-film decal interconnect to which they are thermosonically bonded using the novel backside-through-via decal-to-die bonding process described herein.

After die 140 and 142 have been bonded to the first surface 88 of decal 16, the surfaces of integrated circuit die 12 and 14 opposite to the surface containing their I/O pads are mechanically bonded to a second surface of die 140 and 142 by means such as conductive epoxy. As shown in FIG. 8, the I/O pads 66 and 68 of die 12 and 70 and 72 of die 14 are connected to contact pads 74 and 76, and 78 and 80 of decal 16 on first surface 88 of decal 16 with bond wires 144. As in the embodiments shown in FIGS. 3, 5, and 7 encapsulant 26 is used to seal the assembly, and the surface is not lapped to prevent damage to bond wires 144 from the lapping process.

After die 12 and 14 have been bonded to the second surface of die 140 and 142, one or more third die 146 and 148 are oriented with their pads in contact with contact pads on a second surface 94 of the thin-film decal interconnect to which the pads are bonded by solder ball reflow, gold to gold with adhesive attach, or particle impregnated bump to aluminum pad with adhesive attach.

After bonding the one or more third die 146 and 148, the surfaces of integrated circuit die 90 and 92, opposite to the surface containing their I/O pads are mechanically bonded to a second surface of die 146 and 148 by means such as conductive epoxy. The I/O pads 96 and 98 of die 90 and 100 and 102 of die 92 are connected to contact pads 104 and 106, and 108 and 110, respectively, on second surface 94 of decal 16 with bond wires 150. As in the previous embodiments encapsulant 26 is used to seal the assembly. Lapping of the surface is not required in order to avoid damaging the bond wires.

Because the second surface 94 of the decal 16 is populated with integrated circuit die, the assembly of FIG. 8 must be connected to a printed circuit board via a peripheral mounting technology, such as a lead frame, shown at reference numeral 114.

What is claimed is:

1. A multichip module packaging structure comprising:

a thin film multilayer interconnect circuit disposed on a baseplate, said baseplate including at least one chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

at least one integrated circuit die having first and second surfaces and disposed entirely within said at least one chip mounting cavity on said first surface of said thin film multilayer interconnect circuit, said at least one integrated circuit die including a plurality of I/O connection pads disposed on said first surface thereof in contact with said first surface of said thin film multilayer interconnect circuit, said at least one integrated circuit die aligned so as to mate said plurality of I/O connection pads with said plurality of first bonding pads, said I/O connection pads electrically connected to said first bonding pads.

2. The multichip module packaging structure of claim 1 wherein said I/O connection pads are electrically connected to said first bonding pads by solder ball reflow.

3. The multichip module packaging structure of claim 1 wherein said I/O connection pads are electrically connected to said first bonding pads by gold to gold with adhesive attach.

4. The multichip module packaging structure of claim 1 wherein said I/O connection pads are electrically connected to said first bonding pads by particle impregnated bump to aluminum pad with adhesive attach.

5. A multichip module packaging structure comprising:

a thin film multilayer interconnect circuit disposed on a baseplate, said baseplate including at least one chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

at least one first integrated circuit die having first and second surfaces and disposed entirely within said at least one chip mounting cavity on said first surface of said thin film multilayer interconnect circuit, said at least one first integrated circuit die including a plurality of first I/O connection pads disposed on said first surface thereof in contact with said first surface of said thin film multilayer interconnect circuit, said at least one first integrated circuit die aligned so as to mate said plurality of I/O connection pads with said plurality of first bonding pads, said first I/O connection pads electrically connected to said first bonding pads; and at least one second integrated circuit die disposed on said second surface of said thin film multilayer interconnect circuit, said at least one second integrated circuit die having a first surface bonded to said second surface of said thin film multilayer interconnect circuit in a position such that said plurality of second bonding pads of said thin film multilayer interconnect circuit are disposed about the periphery of said at least one second integrated circuit die, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit.

6. The multichip module packaging structure of claim 5 wherein said I/O connection pads are electrically connected to said first bonding pads by solder ball reflow.

7. The multichip module packaging structure of claim 5 wherein said I/O connection pads are electrically connected to said first bonding pads by gold to gold with adhesive attach.

8. The multichip module packaging structure of claim 5 wherein said I/O connection pads are electrically connected to said first bonding pads by particle impregnated bump to aluminum pad with adhesive attach.

9. A multichip module packaging structure comprising:

a thin film multilayer interconnect circuit disposed on a baseplate, said baseplate including a plurality of chip mounting cavities formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

a plurality of integrated circuit dice having first and second surfaces, one of said integrated circuit dice disposed within each of said plurality of chip mounting cavities on said first surface of said thin film multilayer interconnect circuit, each of said integrated circuit dice including a plurality of I/O connection pads disposed on said first surface thereof in contact with said first surface of said thin film multilayer interconnect circuit, each of said integrated circuit dice aligned so that its plurality of I/O connection pads align with ones of first bonding pads, said I/O connection pads electrically connected to said first bonding pads.

10. The multichip module packaging structure of claim 9 wherein said I/O connection pads are electrically connected to said first bonding pads by solder ball reflow.

11. The multichip module packaging structure of claim 9 wherein said I/O connection pads are electrically connected to said first bonding pads by gold to gold with adhesive attach.

12. The multichip module packaging structure of claim 9 wherein said I/O connection pads are electrically connected to said first bonding pads by particle impregnated bump to aluminum pad with adhesive attach.

13. The multichip module packaging structure of claim 9 further including a layer of encapsulant disposed over said plurality of integrated circuit dice in said at least one chip mounting cavity.

14. A multichip module packaging structure comprising:

a thin film multilayer interconnect circuit disposed on a baseplate, said baseplate including a plurality of chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

a plurality of integrated circuit dice having first and second surfaces, one of said integrated circuit dice disposed within each of said chip mounting cavities on said first surface of said thin film multilayer interconnect circuit, each of said first integrated circuit dice including a plurality of first I/O connection pads disposed on said first surface thereof in contact with said first surface of said thin film multilayer interconnect circuit, each of said integrated circuit dice aligned so that its plurality of I/O connection pads align with ones of first bonding pads, said first I/O connection pads electrically connected to said first bonding pads; and at least one second integrated circuit die disposed on said second surface of said thin film multilayer interconnect circuit, said at least one second integrated circuit die having a first surface bonded to said second surface of said thin film multilayer interconnect circuit in a position such that said plurality of second bonding pads of said thin film multilayer interconnect circuit are disposed about the periphery of said at least one second integrated circuit die, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit.

15. The multichip module packaging structure of claim 14 wherein said I/O connection pads are electrically connected to said first bonding pads by solder ball reflow.

16. The multichip module packaging structure of claim 14 wherein said I/O connection pads are electrically connected to said first bonding pads by gold to gold with adhesive attach.

17. The multichip module packaging structure of claim 14 wherein said I/O connection pads are electrically connected to said first bonding pads by particle impregnated bump to aluminum pad with adhesive attach.

18. The multichip module packaging structure of claim 14 further including a layer of encapsulant disposed over said first and second integrated circuit dice.

19. The multichip module packaging structure of claim 14 wherein said at least one second integrated circuit die comprises a plurality of integrated circuit dice.

20. A multichip module packaging structure comprising:
a thin film multilayer interconnect circuit disposed on a baseplate, said baseplate including at least one chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

at least one first integrated circuit die having first and second surfaces and disposed within said at least one chip mounting cavity on said first surface of said thin film multilayer interconnect circuit, said at least one first integrated circuit die including a plurality of first I/O connection pads disposed on said first surface thereof in contact with said first surface of said thin film multilayer interconnect circuit, said at least one first integrated circuit die aligned so as to mate said plurality of I/O connection pads with said plurality of first bonding pads, said first I/O connection pads electrically connected to said first bonding pads;

at least one second integrated circuit die disposed on said second surface of said thin film multilayer interconnect circuit, said at least one second integrated circuit die having a first surface bonded to said second surface of said thin film multilayer interconnect circuit in a position such that said plurality of second bonding pads of said thin film multilayer interconnect circuit are disposed about the periphery of said at least one second integrated circuit die, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit;

a leadframe having outer leads extending outside of a periphery of said multichip module packaging structure and having inner bond leads electrically bonded to ones of said plurality of second bonding pads of said thin film multilayer interconnect circuit disposed about a periphery thereof;

a multi-layer laminate board mechanically bonded over said second surface of said thin film multilayer interconnect circuit and over said inner bond leads of said lead frame, said multilayer laminate board having a first layer including conductive pads extending outward from about an inner periphery thereof, said multilayer laminate board further having a second layer including apertures formed therethrough, said apertures aligned with outwardly extending portions of said conductive pads and exposing an upper surface of said conductive pads.

21. The multichip module packaging structure of claim 20 wherein said I/O connection pads are electrically connected to said first bonding pads by solder ball reflow.

22. The multichip module packaging structure of claim 20 wherein said I/O connection pads are electrically connected to said first bonding pads by gold to gold with adhesive attach.

23. The multichip module packaging structure of claim 20 wherein said I/O connection pads are electrically connected to said first bonding pads by particle impregnated bump to aluminum pad with adhesive attach.

24. The multichip module packaging structure of claim 20 further including a layer of encapsulant disposed over said at least one first and second integrated circuit die.

25. A multichip module packaging structure comprising:
a thin film multilayer interconnect circuit disposed on a baseplate, said baseplate including at least one chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

at least one first integrated circuit die disposed in said at least one chip mounting cavity on said first surface of said thin film multilayer interconnect circuit, said at least one first integrated circuit die having a first surface bonded to said first surface of said thin film multilayer interconnect circuit in a position such that said plurality of first bonding pads of said thin film multilayer interconnect circuit are disposed about the periphery of said at least one first integrated circuit die, said at least one first integrated circuit die including a plurality of first I/O connection pads disposed on a second surface thereof opposed to said first surface thereof, ones of said plurality of first I/O connection pads wire bonded to corresponding ones of said plurality of first bonding pads of said thin film multilayer interconnect circuit;

at least one second integrated circuit die disposed on said second surface of said thin film multilayer interconnect circuit, said at least one second integrated circuit die having a first surface bonded to said second surface of said thin film multilayer interconnect circuit in a position such that said plurality of second bonding pads of said thin film multilayer interconnect circuit are disposed about the periphery of said at least one second integrated circuit die, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit; and a leadframe having outer leads extending outside of a periphery of said multichip module packaging structure and having inner bond leads electrically bonded to ones of said plurality of second bonding pads of said thin film multilayer interconnect circuit disposed about a periphery thereof;

a multi-layer laminate board mechanically bonded over said second surface of said thin film multilayer interconnect circuit and over said inner bond leads of said lead frame, said multilayer laminate board having a first layer including conductive pads extending outward from about an inner periphery thereof, said multilayer laminate board further having a second layer including apertures formed therethrough, said apertures aligned with outwardly extending portions of said conductive pads and exposing an upper surface of said conductive pads.

26. The multichip module packaging structure of claim 25 further including a layer of encapsulant disposed over said at least one first and second integrated circuit die.

27. A multichip module packaging structure comprising:

a thin film multilayer interconnect circuit disposed on a baseplate, said baseplate including at least one chip mounting cavity formed therein, said thin film multilayer interconnect circuit comprising a layer including a plurality of first bonding pads on a first surface thereof, a layer including a plurality of second bonding pads disposed on a second surface thereof, and at least one routing layer including a plurality of routing conductors;

at least one first integrated circuit die disposed entirely within said at least one chip mounting cavity on said first surface of said thin film multilayer interconnect circuit, said at least one first integrated circuit die having first and second surfaces, wherein on said first surface thereof, a plurality of first I/O connection pads in contact with said first surface of said thin film multilayer interconnect circuit, said at least one first integrated circuit die aligned for mating said plurality of first I/O connection pads with a plurality of first bonding pads, said first I/O connection pads electrically connected to said first bonding pads;

at least one second integrated circuit die disposed on said second surface of said at least one first integrated circuit die, said at least one second integrated circuit die having a first surface bonded to said second surface of said at least one first integrated circuit die in a position such that said plurality of second bonding pads of said thin film multilayer interconnect circuit are disposed about the periphery of said at least one first integrated circuit die and said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit; and at least one third integrated circuit die disposed on said second surface of said thin film multilayer interconnect circuit, said at least one third integrated circuit die having a first surface bonded to said second surface of said thin film multilayer interconnect circuit in a position such that a plurality of third bonding pads of said thin film multilayer interconnect circuit are disposed about the periphery of said at least one third integrated circuit die, said at least one third integrated circuit die including a plurality of third I/O connection pads disposed on a second surface thereof opposed to said first surface thereof, ones of said plurality of third I/O connection pads wire bonded to corresponding ones of said plurality of third bonding pads of said thin film multilayer interconnect circuit.

28. The multichip module packaging structure of claim 26 wherein said first I/O connection pads are electrically connected to said first bonding pads by solder ball reflow.

29. The multichip module packaging structure of claim 26 wherein said first I/O connection pads are electrically connected to said first bonding pads by gold to gold with adhesive attach.

30. The multichip module packaging structure of claim 26 wherein said first I/O connection pads are electrically connected to said first bonding pads by particle impregnated bump to aluminum pad with adhesive attach.

31. The multichip module packaging structure of claim 26 further including a layer of encapsulant disposed over said plurality of integrated circuit dice.

32. A multichip module packaging structure comprising:

a thin film multilayer interconnect circuit disposed on a baseplate, said baseplate including at least one chip mounting cavity formed therein, said thin film multilayer interconnect circuit comprising a layer including a plurality of first bonding pads disposed on a first surface thereof, a layer including a plurality of second bonding pads disposed on a second surface thereof, and at least one routing layer including a plurality of routing conductors;

at least one first integrated circuit die disposed within said at least one chip mounting cavity and on said first surface of said thin film multilayer interconnect circuit, said at least one first integrated circuit die having first and second surfaces, wherein a plurality of first I/O connection pads disposed on said first surface thereof in contact with said first surface of said thin film multilayer interconnect circuit, said at least one first integrated circuit die aligned for mating said plurality of first I/O connection pads with said plurality of first bonding pads, said first I/O connection pads electrically connected to said first bonding pads;

at least one second integrated circuit die disposed within said at least one chip mounting cavity, said at least one second integrated circuit die having a first surface bonded to said second surface of said at least one first integrated circuit in a position such that said plurality of second bonding pads of said thin film multilayer interconnect circuit are disposed about the periphery of said at least one first integrated circuit die and of said at least one second integrated circuit, said at least one second integrated circuit die including a plurality of second I/O connection pads disposed on a second surface thereof opposed to said first surface thereof, ones of said plurality of second I/O connection pads wire bonded to corresponding ones of said plurality of second bonding pads of said thin film multilayer interconnect circuit;

at least one third integrated circuit die disposed on said first surface of said thin film multilayer interconnect circuit, said at least one third integrated circuit die having first and second surfaces, wherein a plurality of third I/O connection pads disposed on said first surface thereof in contact with said first surface of said thin film multilayer interconnect circuit, said at least one third integrated circuit die aligned for mating said plurality of third I/O connection pads with said plurality of first bonding pads, said third I/O connection pads electrically connected to said first bonding pads; and at least one fourth integrated circuit die having a first surface bonded to said second surface of said at least one third integrated circuit die in a position such that said plurality of fourth bonding pads of said thin film multilayer interconnect circuit are disposed about the periphery of said at least one third integrated circuit die and said at least one fourth integrated circuit die, wherein said at least one fourth integrated circuit die having a plurality of fourth I/O connection pads disposed on a second surface thereof opposed to said first surface thereof, ones of said plurality of fourth I/O connection pads wire bonded to corresponding ones of said plurality of fourth bonding pads of said thin film multilayer interconnect circuit.

33. The multichip module packaging structure of claim 31 wherein said first I/O connection pads and said first bonding pads, and said third I/O connection pads and said third bonding pads are electrically connected by solder ball reflow.

34. The multichip module packaging structure of claim 31 wherein said first I/O connection pads are electrically bonded to said first bonding pads, and said third I/O connection pads are electrically bonded to said third bonding pads by gold to gold with adhesive attach.

35. The multichip module packaging structure of claim 31 wherein said first I/O connection pads are electrically bonded to said first bonding pads, and said third I/O connection pads are electrically bonded to said third bonding pads by particle impregnated bump to aluminum pad with adhesive attach.

36. The multichip module packaging structure of claim 31 further including a layer of encapsulant disposed over said plurality of integrated circuit dice.

* * * * *

UNITED STATES PATENT AND TRADEMARK OFFICE
CERTIFICATE OF CORRECTION

PATENT NO. : 5,796,164
DATED : August 18, 1998
INVENTOR(S) : Mark T. McGraw et al.

It is certified that error appears in the above-identified patent and that said Letters Patent is hereby corrected as shown below:

Column 5,
Line 35, replace "interconnect ." with -- interconnect. --.

Column 11,
Line 2, replace "62d" with -- 62b --.

Column 20,
Lines 23, 26, 30 and 34, replace "26" with -- 27 --.

Column 22,
Line 6, 11, 16 and 22, replace "31" with -- 32 --.

Signed and Sealed this

Nineteenth Day of August, 2003

JAMES E. ROGAN
*Director of the United States Patent and Trademark Office*